United States Patent [19]

Bise

[11] 4,321,616

[45] Mar. 23, 1982

[54] FIELD CONTROLLED HIGH VALUE RESISTOR WITH GUARD BAND

[75] Inventor: Tomokazu Bise, Tokyo, Japan

[73] Assignee: Oki Electric Industry Co., Ltd., Tokyo, Japan

[21] Appl. No.: 129,408

[22] Filed: Mar. 11, 1980

[30] Foreign Application Priority Data

Mar. 16, 1979 [JP] Japan .................. 54-29856

[51] Int. Cl.³ .......................................... H01L 27/02
[52] U.S. Cl. ....................................... 357/51; 357/23;
357/52; 357/53; 357/86
[58] Field of Search .................. 357/51, 52, 53, 42, 357/86, 23

[56] References Cited

U.S. PATENT DOCUMENTS

| | | | |
|---|---|---|---|
| 3,226,612 | 12/1965 | Haenichen | 357/52 |
| 3,302,076 | 1/1967 | Kang et al. | 357/53 |
| 3,309,245 | 3/1967 | Haenichen | 357/52 |
| 3,363,152 | 1/1968 | Lin | 357/51 |
| 3,440,502 | 4/1969 | Lin et al. | 357/52 |
| 3,518,750 | 7/1970 | Moyle | 357/52 |
| 3,566,219 | 2/1971 | Nelson et al. | 357/53 |
| 3,936,676 | 2/1976 | Fujita | 357/42 |
| 4,005,471 | 1/1977 | Magdo et al. | 357/51 |
| 4,044,371 | 8/1977 | Abdelrahman et al. | 357/51 |
| 4,063,274 | 12/1977 | Dingwall | 357/53 |
| 4,072,974 | 2/1978 | Ipri | 357/51 |
| 4,172,260 | 10/1979 | Okabe et al. | 357/51 |
| 4,212,025 | 7/1980 | Hirasawa et al. | 357/51 |

OTHER PUBLICATIONS

J. MacDougall et al., "Ion Implantation Offers a Bagfol of Benefits for Mos, " Electronics, Jun. 22, 1970, pp. 86-90.

Primary Examiner—Joseph E. Clawson, Jr.
Attorney, Agent, or Firm—Wenderoth, Lind & Ponack

[57] ABSTRACT

A high resistance region is formed by implanting ions of an impurity of one conductivity type at a low concentration into a surface of a substrate of a semiconductivity type of the opposite conductivity. An electroconductive film is formed on the high resistance region with an electric insulating film therebetween for applying a reverse bias potential to a PN junction between the semiconductor substrate and the high resistance region.

3 Claims, 5 Drawing Figures

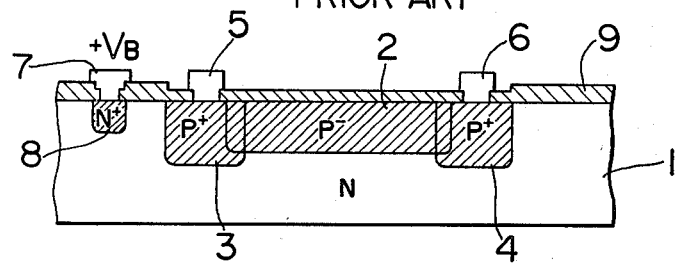
FIG_1 PRIOR ART
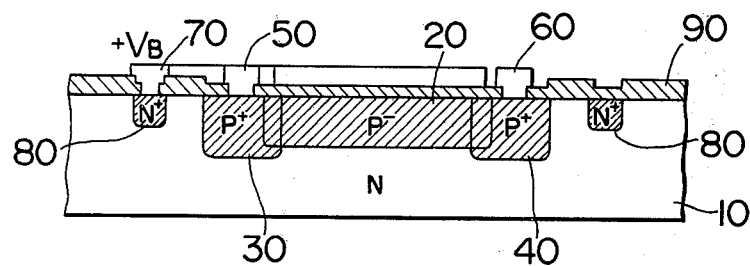
FIG_2

FIG_3
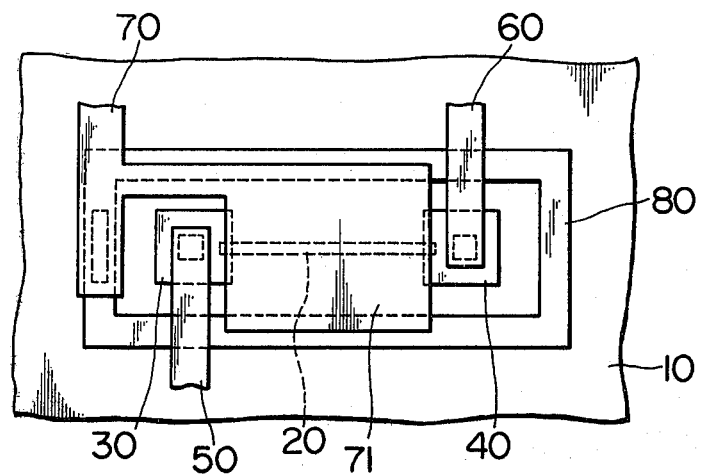
FIG_4
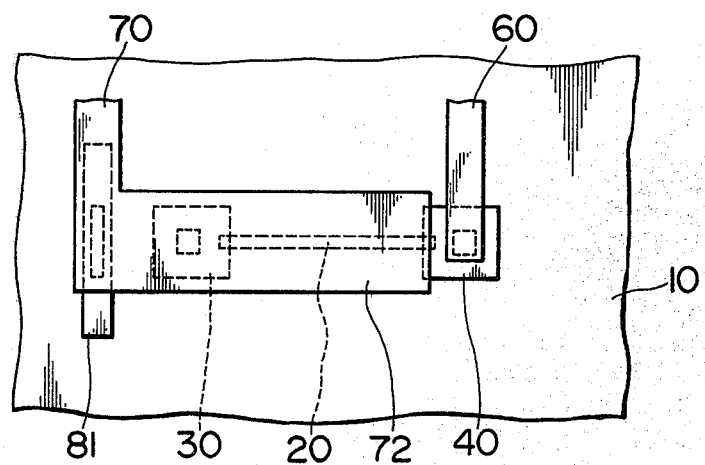

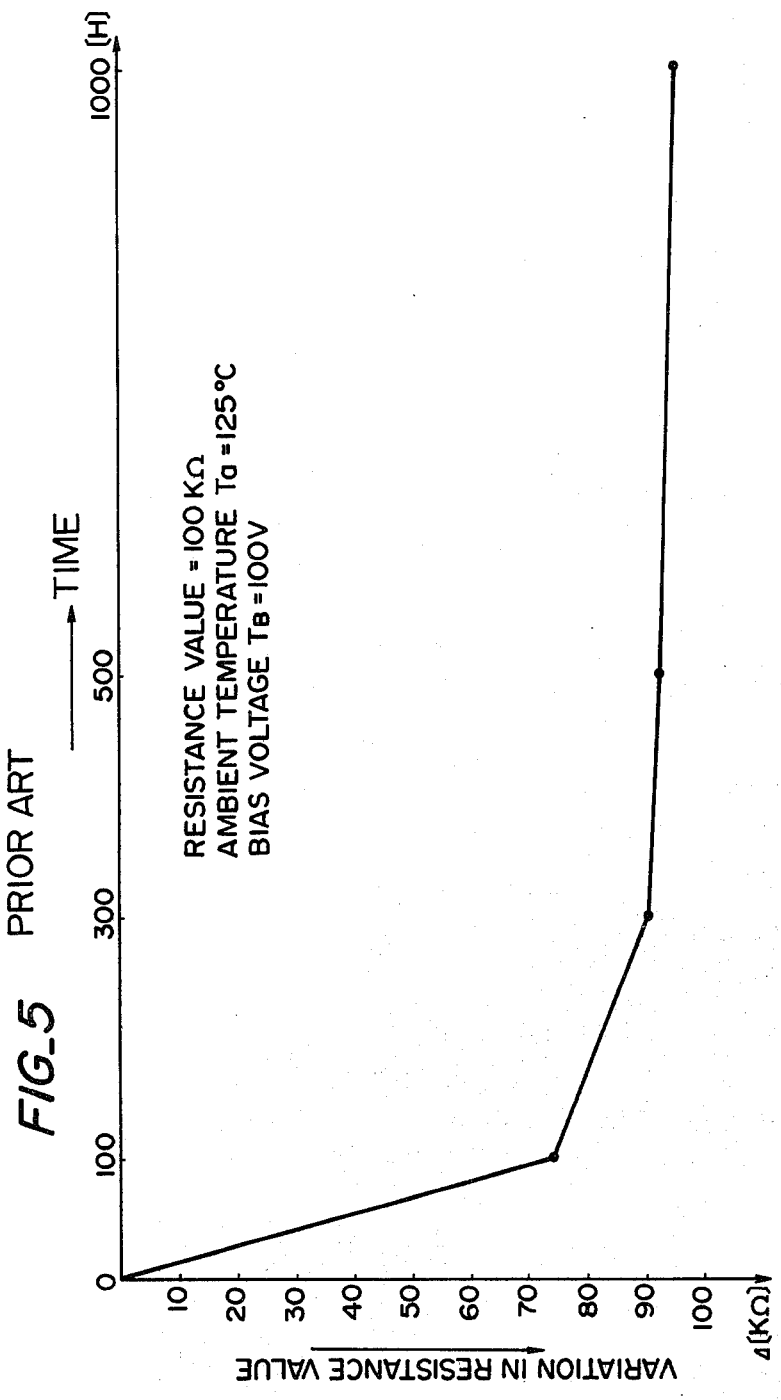

FIELD CONTROLLED HIGH VALUE RESISTOR WITH GUARD BAND

BACKGROUND OF THE INVENTION

This invention relates to a resistor utilized in a semiconductor integrated circuit, and more particularly, to an ion implanted resistor which is stable with respect to aging.

In most cases, diffused resistors have been used as resistors in semiconductor integrated circuits, but the recent tendency is to use resistors implanted with ions for the purpose of obtaining high sheet resistance of a small area and having a resistance of more than 1 to 10 kiloohms for the particular area. FIG. 1 shows a cross-sectional view of a prior art ion implanted resistor comprising an N type semiconductor substrate 1, a high resistance layer 2 formed by ion implantation, P+ regions 3 and 4 for providing non-rectifying contacts, i.e. ohmic contacts, combined electrode and metal wiring layers 5 and 6 for the resistance layer 2, a bias applying electrode 7 for applying a reverse bias to a PN junction formed between the N type semiconductor substrate 1 and the resistance layer 2, an N+ region 8 for forming an ohmic contact, and an insulating silicon dioxide ($SiO_2$) film 9.

When the ion implanted resistor shown in FIG. 1 is used in a semiconductor integrated circuit having a breakdown strength of 50 to 200 volts, for example, the N type semiconductor substrate 1 is required to have an impurity concentration of the order of about $1.5 \times 10^{15} - 1.5 \times 10^{16}$ ions/cm$^3$. In order to form an ion implanted high resistance layer 2 having a sheet resistance of about 1–10 K$\Omega$ for a particular area in the substrate, the resistance layer is required to have an impurity concentration of the order of about $5 \times 10^{16} - 5 \times 10^{17}$ ions/cm$^3$. These impurity concentrations are relatively low so that when the high resistance layer 2 with a low concentration is formed on such a low concentration N type semiconductor substrate 1, negative ions existing in the $SiO_2$ film 9 or in a sealing film, not shown, coated on the surface of the low resistance layer create a negative charge in the $SiO_2$ film 9, whereby a P type inversion layer will be formed on the surface of the N type semiconductor substrate 1. This phenomenon is enhanced with the passage of time by a positive high voltage applied to the bias electrode 7. When the P type inversion layer is formed on the surface of the semiconductor substrate, the width of the resistance layer increases, thus tending to decrease the resistance value. In an ion implanted resistor, the degree of reduction of the resistance value is very large. FIG. 5 shows the variation in the resistance value caused by aging. The data depicted were obtained by forming 50 ion implanted resistors each having an initial resistance value of 100 K$\Omega$ on a semiconductor substrate and then encapsulating the assembly with an epoxy type transfer molding resin. When an accelerated test was made at an ambient temperature of $T_a = 125°$ C. and with a bias voltage of $V_B = 100$ V, it was found that the initial resistance value decreased greatly, i.e. by 75% after 100 hours of the acceleration test. Thus, the prior art ion implanted resistance is not suitable for practical use. For the purpose of obviating such variation in the characteristic, even when a stabilizing film comprising a passivating silicon dioxide film or a double layered passivating silicon dioxide film doped or not doped with phosphor is applied onto the semiconductor substrate by a chemical vapor deposition (CVD) process, a characteristic similar to that shown in FIG. 5 was obtained showing that a stable ion implanted resistor is difficult to obtain.

SUMMARY OF THE INVENTION

Accordingly, it is an object of this invention to provide a highly stable ion implanted resistor having a high resistance and suitable for use in a semiconductor integrated circuit having a high breakdown voltage, wherein variation in the resistance value due to aging in a semiconductor layer having a low impurity concentration is prevented.

Briefly stated, according to this invention there is provided a stable ion implanted resistor comprising a high resistance region formed by implanting ions of one conductivity type into a surface of a semiconductor substrate of the opposite conductivity type; first and second electrode lead out regions formed by diffusing an impurity having the same conductivity type as the high resistance region into portions of the surface at both ends of the high resistance region; a channel stop region having the same conductivity type as the semiconductor substrate, the channel stop region being formed by diffusion into the surface of the semiconductor substrate to surround the high resistance region and the first and second electrode lead out regions; an electric insulating film formed on the surface of the semiconductor substrate; and an electroconductive film extending from the high resistance region to the channel stop region on both sides of the high resistance region to cover the insulating film, the electroconductive film being used to apply a reverse bias potential to the PN junction formed between the semiconductor substrate and the high resistance region.

According to a modified embodiment of this invention there is provided a stable ion implanted resistor comprising a high resistance region formed by implanting ions of one conductivity impurity into a surface of a semiconductor substrate of the opposite conductivity type; first and second electrode lead out regions formed by diffusing an impurity having the same conductivity type as the high resistance region into portions of the surface at both ends of the high resistance region; an electric insulating film formed on the surface of the semiconductor substrate; and an electroconductive film covering a portion of the insulating film around the high resistance region and utilized to apply a reverse bias potential to the PN junction formed between the first and second electrode lead out regions, the semiconductor substrate and the high resistance region.

BRIEF DESCRIPTION OF THE DRAWINGS

In the accompanying drawings

FIG. 1 is a sectional view showing a prior art ion implanted resistor;

FIG. 2 is a sectional view showing an ion implanted resistor according to the present invention;

FIG. 3 is a top plan view of a first embodiment of this invention;

FIG. 4 is a top plan view of a second embodiment of this invention; and

FIG. 5 is a graph showing the amount of resistance variation with respect to time of a prior art ion implanted resistor.

DESCRIPTION OF THE PREFERRED EMMBODIMENTS

Referring now to FIGS. 2 and 3 which show a first embodiment of this invention, the resistor shown therein comprises a substrate 10 made of silicon doped with an N type inpurity such as antimony, arsenic or phosphor at a concentration of about $1.5 \times 10^{15} - 1.5 \times 10^{16}$ ions/cm$^3$. The N type semiconductor substrate 10 may be epitaxially formed on a P type silicon substrate. A high resistance region 20 is formed in the substrate 10 by implanting ions of a P type impurity such as aluminum, boron or indium to a depth of about 0.2 to 1 micron with an acceleration voltage of about 20 to 200 KeV. To obtain a sheet resistance value of 1 to 10 K$\Omega$ for the particular area, for example, an impurity is doped at a concentration of about $5 \times 10^{16} - 5 \times 10^{17}$ ions/cm$^3$. Ohmic contact regions 30 and 40 are formed at both ends of the high resistance region 20 by diffusing such P type impurity as aluminum and boron at a high concentration of $5 \times 10^{17} - 5 \times 10^{18}$ ions/cm$^3$ and then metalizing the diffused regions. An annular rectangular region 80 surrounding the high resistance region 20 so as to act as a channel stop region is formed by doping an N type impurity, for example, antimony, arsenic or phosphor to a depth of about 1–10 microns at a high concentration of about $5 \times 10^{19} - 1 \times 10^{21}$ ions/cm$^3$. Electroconductive wiring layers 50 and 60 are provided to act as high resistance electrode leads for the high resistance region 20, the wiring layers being made of metal, preferably aluminum, or a semiconductor material. Electroconductive wiring layers 70 or 71, preferably made of such metal as aluminum or semiconductor material are formed to cover the ion implanted resistance region 20 and the N+ region 80 surrounding the same with a SiO$_2$ film 90 therebetween and to form an ohmic contact with the N+ region 80. The wiring layer is supplied with a positive voltage V$_B$ for applying a reverse bias to the PN junction between the ion implanted resistance region 20 and the N type semiconductor substrate 10. A positive potential (for example 50 to 200 V) is also applied to the metal wiring layer 71 overlying the ion implanted region 20 so that negative ions present in the SiO$_2$ film overlying the resistance region 20 are attracted by the metal wiring layer on the SiO$_2$ film. The positive ions present near the resistance region 20 are repelled toward the lower portion of the semiconductor substrate 10 and fixed at that portion. In the first embodiment shown in FIG. 2 wherein one end of the resistor is not directly coupled to a source, it is necessary to extend the metal wiring layer 71 to overlay the N+ region 80 surrounding the resistance region 20. This construction prevents interconnection of P+ regions 30 and 40 by a P type resistance component layer formed by an inversion prevailing on the surface of the silicon substrate 10. As above described, according to this invention, because it is possible to prevent extension of the P type inversion layer over a prior art resistance layer implanted with ions the initial resistance value remains stable.

In the second embodiment of this invention shown in FIG. 4, an N+ region 81 is formed by diffusion into the semiconductor substrate 10 at a position spaced from the electrode lead out region 30. An electroconductive wiring layer 70 and an electroconductive film 72 are provided to form ohmic contact with the N+ diffused region 81 and the electrode lead out region 30, and the region 30 and the film 72 are connected to a source, not shown.

In a case in which one end of the resistance region is connected directly to the source as above described, formation of a P type inversion layer can be prevented by disposing a metal wiring layer on the ion implanted region 20 between the resistance region and the electrode lead out region and the semiconductor substrate, the metal wiring layer being used to apply a reverse bias potential.

In this case, it is not necessary to surround the high resistance region 20 with the P+ region 81. This construction is effective in the same manner as in the first embodiment.

50 ion implanted resistors according to the invention were formed on a semiconductor substrate and encapsulated with an epoxy type transfer molding resin, and an accelerated test was made at an ambient temperature of $T_a = 125°$ C. and with a bias voltage of $V_B = 100$ V. It was found that the initial resistance value decreased less than 0.5% after 1000 hours.

As above described the invention makes it possible to form a resistor implanted with P type ions at a low concentration in a low concentration N type semiconductor substrate or in an epitaxial layer, the resistor being characterized in that there is no appreciable variation in the resistance value caused by aging so that the resistor can be advantageously incorporated into a semiconductor integrated circuit containing elements having high breakdown voltage and high resistance elements.

Moreover, since the variation in the resistance value of the ion implanted resistor of the present invention is small and since the resistance value is accurate and stable, it is not necessary to take into consideration such variation in the resistance value at the time of designing a semiconductor integrated circuit.

Although in the embodiments described above the conductivity type of the semiconductor substrate is of the N type and that of the resistor region is of the P type, such conductivity types may be reversed in which case negative potential is used as the reverse bias voltage.

What is claimed is:

1. A stable ion implanted resistor comprising:
   a high resistance region having ions of one conductivity type impurity diffused into a surface region of a semiconductor substrate of the opposite conductivity type;
   first and second electrode lead out regions having ions of an impurity of the same conductivity type as said high resistance region diffused into portions of said surface at both ends of said high resistance region;
   a channel stop region having the same conductivity type as said semiconductor substrate, said channel stop region having ions of an impurity diffused into said surface of the semiconductor substrate and surrounding said high resistance region and said first and second electrode lead out regions and spaced from said high resistance region and said lead out regions;
   an electric insulating film on said surface of said semiconductor substrate; and
   an electroconductive film extending from said high resistance region to said channel stop region on both sides of said high resistance region and covering said insulating film, and connected to said channel stop region and being for applying a reverse bias potential through said channel stop region to the PN junction formed between said semiconductor substrate and said high resistance region.

2. The stable ion implanted resistor as defined in claim 1 wherein both said semiconductor substrate and said high resistance region are doped with an impurity at a low concentration and wherein both said first and second electrode lead out regions and said channel stop regions have an impurity diffused thereinto at a high concentration.

3. A stable impurity implanted resistor as defined in claim 2 wherein the impurity concentration of said semiconductor substrate is about $1.5 \times 10^{15} - 1.5 \times 10^{16}$ ions/cm$^3$, the impurity in said high resistance region is diffused to a depth of about 0.2-1 micron at an accelerating voltage of about 20 to 200 KeV and has a concentration of about $5 \times 10^{16} - 5 \times 10^{17}$ ions/cm$^3$, the impurity concentration of said first and second electrode lead out regions is about $5 \times 10^{17} - 5 \times 10^{18}$ ions/cm$^3$, and the impurity concentration of said channel stop region is about $5 \times 10^{19} - 5 \times 10^{21}$ ions/cm$^3$.

* * * * *